US011532359B2

(12) United States Patent
Kobayashi

(10) Patent No.: US 11,532,359 B2
(45) Date of Patent: Dec. 20, 2022

(54) SEMICONDUCTOR DEVICE HAVING A LEVEL CONVERSION CIRCUIT

(71) Applicant: KIOXIA CORPORATION, Tokyo (JP)

(72) Inventor: Osamu Kobayashi, Sagamihara Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/177,083

(22) Filed: Feb. 16, 2021

(65) Prior Publication Data
US 2021/0280252 A1   Sep. 9, 2021

(30) Foreign Application Priority Data

Mar. 5, 2020   (JP) .............................. JP2020-038110

(51) Int. Cl.
*G11C 7/00*   (2006.01)
*G11C 16/04*   (2006.01)
*G11C 16/08*   (2006.01)
*G11C 16/30*   (2006.01)

(52) U.S. Cl.
CPC .......... *G11C 16/0483* (2013.01); *G11C 16/08* (2013.01); *G11C 16/30* (2013.01)

(58) Field of Classification Search
CPC ..... G11C 16/0483; G11C 16/08; G11C 16/30; G11C 5/144; G11C 5/147; G11C 29/021; G11C 29/028; G11C 8/12

USPC .................................................. 365/189.011
See application file for complete search history.

(56) References Cited

U.S. PATENT DOCUMENTS

| 4,763,108 | A | * | 8/1988 | Kobayashi | .............. | H03M 7/06 |
| | | | | | | 341/150 |
| 6,438,032 | B1 | * | 8/2002 | Pekny | .................... | G11C 16/12 |
| | | | | | | 365/185.25 |
| 10,083,755 | B2 | | 9/2018 | Haibi et al. | | |
| 2005/0151527 | A1 | * | 7/2005 | Noda | ...................... | G05F 3/242 |
| | | | | | | 323/313 |

FOREIGN PATENT DOCUMENTS

JP         2018121243 A      8/2018

* cited by examiner

*Primary Examiner* — Tha-O H Bui
(74) *Attorney, Agent, or Firm* — Kim & Stewart LLP

(57) ABSTRACT

A semiconductor device includes a level conversion circuit. The level conversion circuit includes a first transistor, a second transistor, a current limiting element, and a voltage adjusting circuit. The first transistor includes a gate connected to an input node. A signal corresponding to a first power supply voltage is input to the input node. The second transistor has a source connected to a drain of the first transistor, a drain connected to a second power supply voltage that is higher than the first power supply voltage, and a gate connected to a first node. The current limiting element is electrically connected between the first node and an output node. The voltage adjusting circuit adjusts a voltage of the first node in accordance with the signal input to the input node.

20 Claims, 9 Drawing Sheets

SEMICONDUCTOR DEVICE HAVING A LEVEL CONVERSION CIRCUIT

CROSS-REFERENCE TO RELATED APPLICATION(S)

This application is based upon and claims the benefit of priority from Japanese Patent Application No. 2020-038110, filed Mar. 5, 2020, the entire contents of which are incorporated herein by reference.

FIELD

Embodiments described herein relate generally to a semiconductor device, particularly a semiconductor storage device.

BACKGROUND

A semiconductor device may include a level conversion circuit to output a high voltage signal. In such a semiconductor device, a signal level may be converted by the level conversion circuit to perform a predetermined operation, and it is desirable to quickly and reliably convert the signal level.

DETAILED DESCRIPTION

Embodiments provide a semiconductor device that can quickly convert a signal level.

In general, according to one embodiment, a semiconductor device includes a level conversion circuit. The level conversion circuit includes a first transistor, a second transistor, a current limiting element, and a voltage adjusting circuit. The first transistor includes a gate connected to an input node. A signal corresponding to a first power supply voltage is input to the input node. The second transistor has a source connected to a source of the first transistor, a drain connected to a second power supply voltage that is higher than the first power supply voltage, and a gate connected to a first node. The current limiting element is electrically connected between the first node and an output node. The voltage adjusting circuit adjusts a voltage of the first node in accordance with the signal input to the input node.

Hereinafter, a semiconductor storage device will be described in detail as the semiconductor device according to the embodiment with reference to the accompanying drawings. The present disclosure is not limited to the following embodiment.

Embodiment

Figure 1:
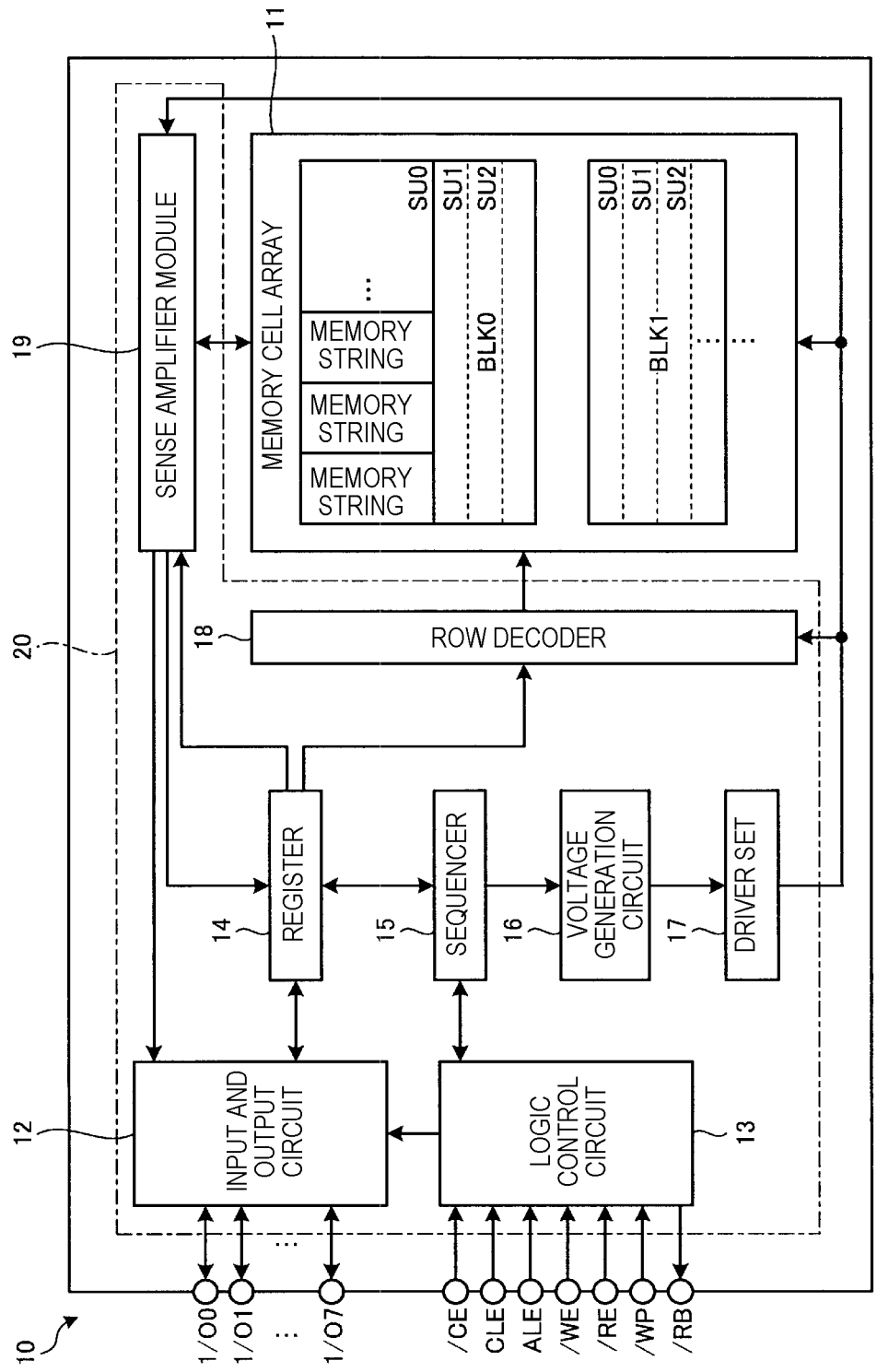
FIG. 1 shows a configuration of a semiconductor device according to an embodiment.

A semiconductor storage device 10 as the semiconductor device according to the embodiment includes, for example, a memory cell array 11 and a peripheral circuit 20. FIG. 1 shows a configuration of the semiconductor storage device 10.

The semiconductor storage device 10 is, for example, a NAND flash memory. The semiconductor storage device 10 includes, for example, the memory cell array 11 and the peripheral circuit 20. The peripheral circuit 20 includes an input and output circuit 12, a logic control circuit 13, a register 14, a sequencer 15, a voltage generation circuit 16, a driver set 17, a row decoder 18, and a sense amplifier module 19.

The memory cell array 11 includes a plurality of blocks BLKs (BLK0, BLK1, . . . ). The block BLK includes a plurality of nonvolatile memory cell transistors (not shown) associated with word lines and bit lines. The block BLK is, for example, an erase unit of data, and data in the same block BLK is collectively erased. Each block BLK includes a plurality of string units SUs (SU0, SU1, SU2, . . . ). Each string unit SU is a set of memory strings MSs. The memory string MS includes a plurality of memory cell transistors. The number of blocks in the memory cell array 11, the number of string units in one block BLK, and the number of memory strings in one string unit SU may be any number.

The input and output circuit 12 transmits a signal I/O <7:0> (I/O0 to I/O7) to and receives the signal I/O <7:0> (I/O0 to I/O7) from an external controller (not shown). The signal I/O <7:0> is, for example, an 8-bit signal. The signal I/O <7:0> is data transmitted and received between the semiconductor storage device 10 and the external controller, and includes a command, an address, and data. The data includes write data and read data. The input and output circuit 12 transfers the command and the address in the signal I/O to the register 14. The input and output circuit 12 transmits and receives the write data and the read data to and from the sense amplifier module 19.

The logic control circuit 13 receives signals /CE, CLE, ALE, /WE, /RE, and /WP from the external controller. Further, the logic control circuit 13 transfers a signal /RB to the external controller and notifies a state of the semiconductor storage device 10 to an outside. The signal /CE is a signal for enabling the semiconductor storage device 10. The signal CLE notifies the semiconductor storage device 10 that the signal I/O <7:0> flowing through the semiconductor storage device 10 is a command when the signal CLE is at an "H (High)" level. The signal ALE notifies the semiconductor storage device 10 that the signal I/O <7:0> flowing through the semiconductor storage device 10 is an address when the signal ALE is at an "H (High)" level. The signal/WE instructs the semiconductor storage device 10 to capture the signal I/O <7:0> flowing through the semiconductor storage device 10 when the signal/WE is at an "L (Low)" level. The signal/RE instructs the semiconductor storage device 10 to output the signal I/O <7:0> to the semiconductor storage device 10. The signal /WP instructs the semiconductor storage device 10 to prohibit data writing and erasing. The signal/RB indicates whether the semiconductor storage device 10 is in a ready state (a state in which an instruction from the outside can be received) or a busy state (a state in which the instruction from the outside cannot be received).

The register 14 stores the command and the address. The register 14 transfers the address to the row decoder 18 and the sense amplifier module 19, and transfers the command to the sequencer 15.

The sequencer 15 receives the command and controls the entire semiconductor storage device 10 according to a sequence based on the received command.

The voltage generation circuit 16 generates a voltage necessary for an operation such as writing, reading, and erasing of data based on an instruction from the sequencer 15. The voltage generation circuit 16 supplies the generated voltage to the driver set 17.

The driver set 17 includes a plurality of drivers, and supplies various voltages from the voltage generation circuit 16 to the row decoder 18 and the sense amplifier module 19 based on the address from the register 14. The driver set 17 supplies various voltages to the row decoder 18 based on, for example, a row address in the address.

The row decoder 18 receives the row address in the address from the register 14, and selects the block BLK based on the row address. Then, the voltage from the driver set 17 is transferred to the selected block BLK via the row decoder 18.

When reading the data, the sense amplifier module 19 senses read data read from the memory cell transistor to the bit line, and transfers the sensed read data to the input and output circuit 12. When writing the data, the sense amplifier module 19 transfers write data written via the bit line to the memory cell transistor. Further, the sense amplifier module 19 receives a column address in the address from the register 14, and outputs data of a column based on the column address.

Figure 2:
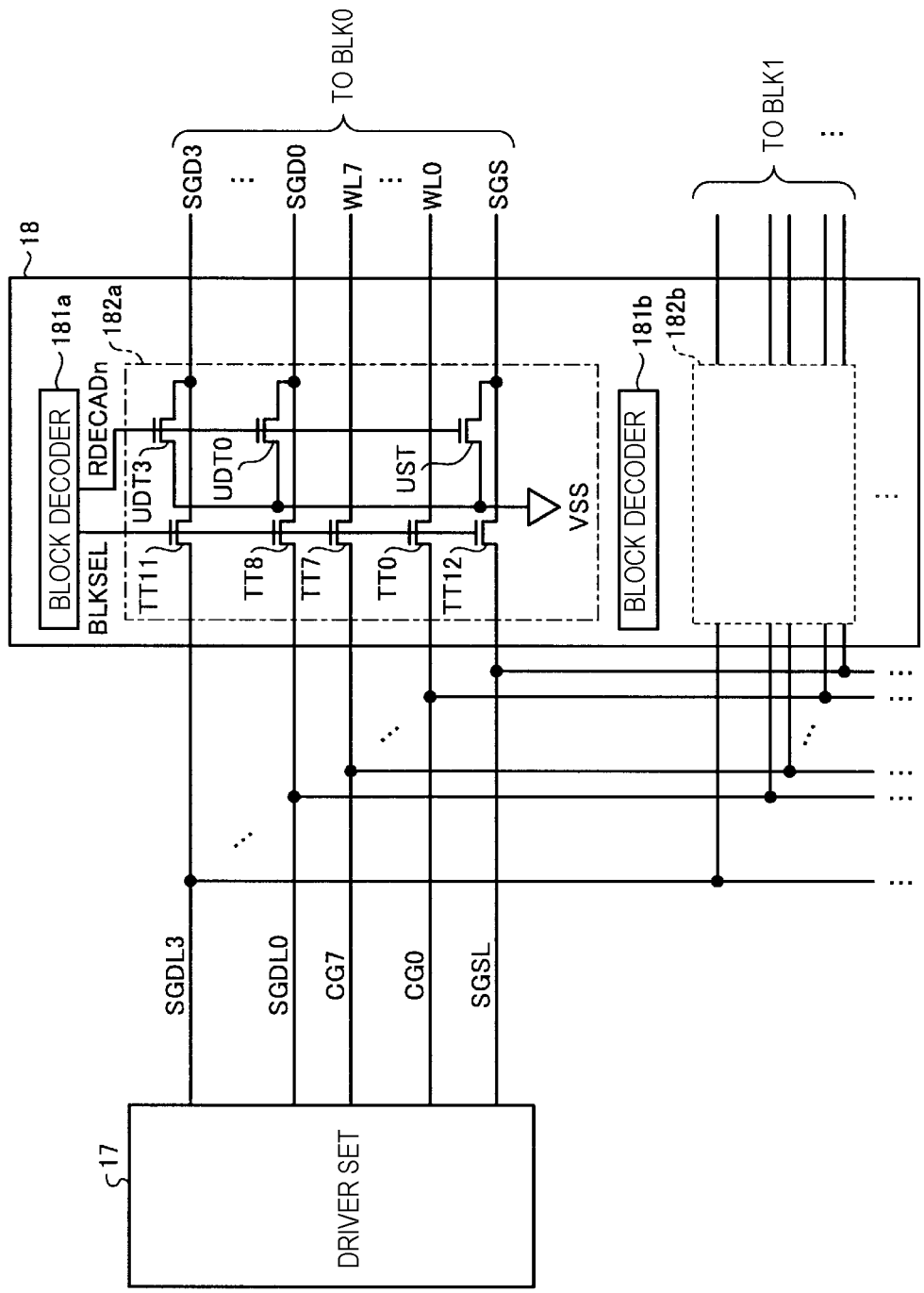
FIG. 2 shows a configuration of a row decoder according to the embodiment.

The row decoder 18 may be configured as shown in FIG. 2. FIG. 2 shows a configuration of the row decoder 18.

The row decoder 18 includes a plurality of block decoders 181 (181*a*, 181*b*, . . . ) and a plurality of transfer switch groups 182 (182*a*, 182*b*, . . . ). The transfer switch group 182 includes transistors TT0 to TT12, transistors UDT0 to UDT3, and a transistor UST.

One block decoder 181 and one transfer switch group 182 are allocated to one block BLK. The block decoder 181 decodes a block address signal received from the register 14 at the time of writing, reading, and erasing of data. When the block decoder 181 determines that a block BLK corresponding to the block decoder 181 is a selected block BLK as a result of decoding, the block decoder 181 outputs a signal BLKSEL of the "H" level and an RDECADn of the "L" level. Further, when the block decoder 181 determines that the corresponding block BLK is not the selected block BLK, the block decoder 181 outputs a signal BLKSEL of the "L" level and an RDECADn of the "H" level.

A signal BLKSEL turns the transistors TT0 to TT12 on when it is at the "H" level, and turns the transistors TT0 to TT12 off when it is at the "L" level. A signal RDECADn turns the transistors UDT0 to UDT3 and the transistor UST on when it is at the "H" level, and turns the transistors UDT0 to UDT3 and the transistor UST off when it is at the "L" level.

First ends of the transistors TT0 to TT7 are connected to signal lines CG0 to CG7 as global word lines, and second ends are connected to word lines WL0 to WL7 as local word lines in the corresponding block BLK. Further, gates of the transistors TT0 to TT7 are commonly connected to a signal line BLKSEL. Accordingly, when the corresponding block BLK is the selected block, the transistors TT0 to TT7 transfer voltages of the signal lines CG0 to CG7 as the global word lines to the word lines WL0 to WL7 as the local word lines by supplying the signal BLKSEL of the "H" level.

First ends of the transistors TT8 to TT11 are connected to signal lines SGDL0 to SGDL3 as global select gate lines, and second ends are connected to drain side select gate lines SGD0 to SGD3 as local select gate lines in the corresponding block BLK. Further, gates of the transistors TT8 to TT11 are commonly connected to the signal line BLKSEL. Accordingly, when the corresponding block BLK is the selected block, the transistors TT8 to TT11 transfer voltages of the signal lines SGDL0 to SGDL3 to the drain side select gate lines SGD0 to SGD3 by supplying the signal BLKSEL of the "H" level.

First ends of the transistors UDT0 to UDT3 are grounded to a voltage VSS, second ends are connected to the select gate line SGD0 to SGD3 of the corresponding block BLK, respectively. Gates thereof are commonly connected to a signal line RDECADn.

A first end of the transistor TT12 is connected to a signal line SGSL as the global select gate line, and a second end is connected to a source side select gate line SGS as the local select gate line in the corresponding block BLK. Further, a gate of the transistor TT12 is commonly connected to the signal line BLKSEL. Accordingly, when the corresponding block BLK is the selected block, the transistor TT12 transfers a voltage of the signal line SGSL as the global select gate line to the source side select gate line SGS as the local select gate line by supplying the signal BLKSEL of the "H" level.

A first end of the transistor UST is grounded to the voltage VSS, a second end is connected to the select gate line SGS of the corresponding block BLK. A gate thereof is commonly connected to the signal line RDECADn.

Therefore, for example, in the transfer switch group 182 corresponding to the selected block BLK, the transistors TT0 to TT12 are turned on, and the transistors UDT0 to UDT3 and the transistor UST are turned off. Accordingly, the word lines WL0 to WL7 are connected to the signal lines CG0 to CG7, respectively, the select gate line SGD0 to SGD3 are connected to the signal lines SGDL0 to SGDL3, respectively, and the select gate line SGS is connected to the signal line SGSL.

On the other hand, in the transfer switch group 182 corresponding to a non-selected block BLK, the transistors TT0 to TT12 are turned off, and the transistors UDT0 to UDT3 and the transistor UST are turned on. Accordingly, the word lines WL are separated from the signal lines CG, and the select gate lines SGD and SGS are separated from the signal lines SGDL and SGSL, respectively.

The driver set 17 supplies voltages to the signal lines CG, SGDL, and SGSL according to the address received from the register 14. The signal lines CG, SGDL, and SGSL transfer the various voltages supplied from the driver set 17 to each of the transfer switch groups 182*a*, 182*b*, . . . . That is, the voltages supplied from the driver set 17 are transferred to the word lines WL, the select gate lines SGD and SGS in the selected block BLK via the transistors TT0 to TT12 in the transfer switch group 182 corresponding to the selected block BLK.

Figure 3:
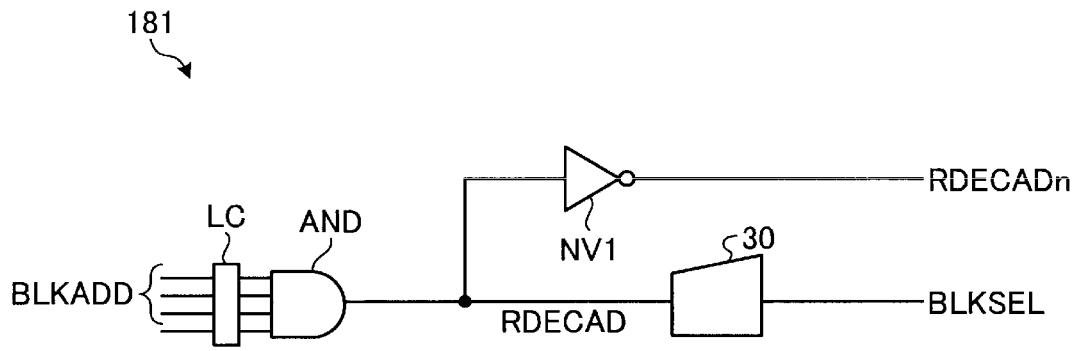
FIG. 3 shows a configuration of a block decoder according to the embodiment.

The block decoder 181 may be configured as shown in FIG. 3. FIG. 3 shows a configuration of the block decoder 181.

The block decoder 181 includes, for example, a logic circuit LC, an AND circuit AND, an inverter NV1, and a level conversion circuit 30.

The logic circuit LC outputs output signals based on a block address signal BLKADD input from the register 14. In the logic circuit LC, all the output signals are at the "H" level in the block decoder 181 in which the block address signal BLKADD is hit, and any one of the output signals is at the "L" level in the block decoder 181 in which the block address signal BLKADD is not hit.

The AND circuit AND outputs an AND result of the output signals of the logic circuit LC to the inverter NV1 and the level conversion circuit 30 as a signal RDECAD. That is, in the block decoder 181 in which the block address signal BLKADD is hit and the corresponding block BLK is determined to be normal, the signal RDECAD of the "H" level is output. Further, in the block decoder 181 in which the block address signal BLKADD is not hit and the corresponding block BLK is determined to be abnormal, the signal RDECAD of the "L" level is output.

The inverter NV 1 inverts the signal RDECAD output from the AND circuit AND. The inverter NV 1 outputs a signal RDECADn as a result of the inversion.

The level conversion circuit 30 converts the signal RDECAD corresponding to a low power supply voltage ($V_B$) into a signal BLKSEL corresponding to a high power supply voltage ($V_H$). Specifically, when the signal RDECAD of the "H" level corresponding to the power supply voltage $V_B$ is input, the level conversion circuit 30 converts this signal to the signal RDECAD of the "H" level corresponding to the power supply voltage $V_H$. The level conversion circuit 30 outputs the converted signal as the signal BLKSEL of the "H" level corresponding to the power supply voltage $V_H$. When the signal RDECAD of the "L" level corresponding to the power supply voltage $V_B$ is input, the level conversion circuit 30 converts this signal to the signal RDECAD of the "L" level corresponding to the power supply voltage $V_H$. The level conversion circuit 30 outputs the converted signal as the signal BLKSEL of the "L" level corresponding to the power supply voltage $V_H$.

With the above configuration, the block decoder 181 outputs the signals BLKSEL and RDECADn having different logic levels to the transfer switch group 182.

Figure 4:
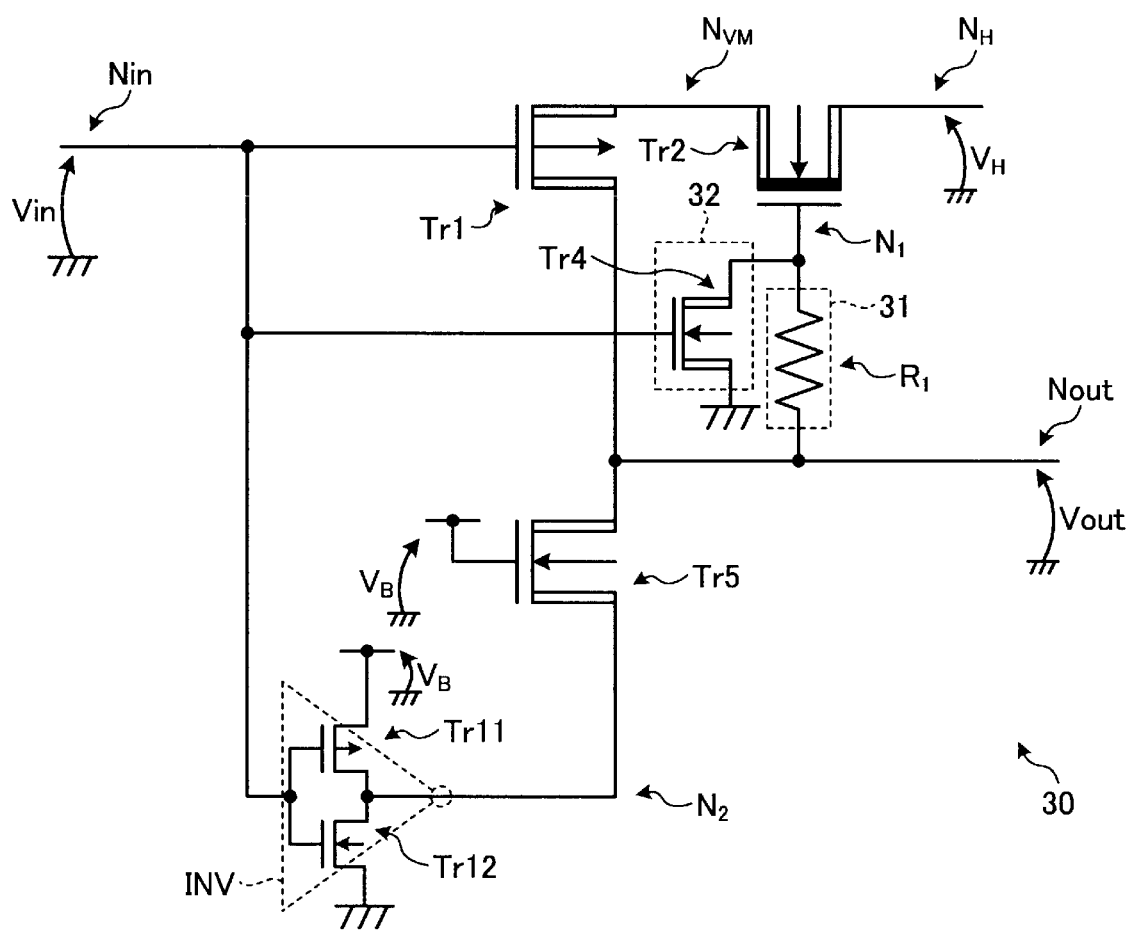
FIG. 4 is a circuit diagram showing a configuration of a level conversion circuit according to the embodiment.

The level conversion circuit 30 shown in FIG. 3 is a circuit that converts a signal level corresponding to the low power supply voltage ($V_B$) into a signal level corresponding to the high power supply voltage ($V_H$). For example, the level conversion circuit 30 may be configured as shown in FIG. 4. The low power supply voltage $V_B$ may be, for example, 5 V, and the high power supply voltage $V_H$ may be, for example, 10 V. FIG. 4 shows a configuration of the level conversion circuit 30. In FIG. 4, a transistor whose gate line is shown in a thick line is a depletion-type transistor, and transistors whose gate lines are shown by lines of a normal thickness are enhancement-type transistors. Further, transistors whose source and drain lines are shown as double lines are high breakdown voltage transistors, and transistors whose source and drain lines are shown as a normal line are normal (non-high breakdown voltage) transistors.

In the present description, the "high breakdown voltage transistor" is a transistor that does not cause element destruction even when a high voltage is applied. In other words, the high breakdown voltage transistor has a higher voltage at which the element destruction occurs compared to a normal (non-high breakdown voltage) transistor. That is, the high breakdown voltage transistor has a higher breakdown voltage than the normal transistor. On the contrary, in the present description, the "low breakdown voltage transistor" is a transistor that may cause the element destruction even when a low voltage is applied. In other words, the low breakdown voltage transistor has a lower voltage at which the element destruction occurs compared to the normal (non-low breakdown voltage) transistor. That is, the low breakdown voltage transistor has a lower breakdown voltage than the normal transistor.

The level conversion circuit 30 includes a transistor Tr1, a transistor Tr2, a transistor Tr5, and an inverter INV.

The transistor Tr1 is, for example, a PMOS transistor, having a gate electrically connected to an input node Nin, a source electrically connected to a node $N_{VM}$, and a drain electrically connected to an output node Nout and the transistor Tr5. The input node Nin is a node for supplying the signal corresponding to the low power supply voltage ($V_B$). The transistor Tr1 is an enhancement-type transistor and is a high breakdown voltage transistor. A breakdown voltage of the transistor Tr1 is, for example, higher than that of a transistor Tr11.

The transistor Tr2 is, for example, an NMOS transistor, having a gate electrically connected to the output node Nout via a node N1, a source electrically connected to the node $N_{VM}$, and a drain electrically connected to a node $N_H$. The output node Nout is a node for outputting the signal corresponding to the high power supply voltage ($V_H$). The transistor Tr2 is a depletion-type transistor and is a high breakdown voltage transistor. A breakdown voltage of the transistor Tr2 is, for example, higher than that of a transistor Tr12.

The inverter INV includes the transistor Tr11 and the transistor Tr12. The transistor Tr11 is, for example, a PMOS transistor, having a gate electrically connected to the input node Nin, a source electrically connected to the power supply voltage $V_B$, and a drain electrically connected to a node N2. The transistor Tr11 is an enhancement-type transistor and is a low breakdown voltage transistor. The transistor Tr12 is, for example, an NMOS transistor, having a gate electrically connected to the input node Nin, a source electrically connected to the ground voltage, and a drain electrically connected to the node N2. The transistor Tr12 is an enhancement-type transistor and is a low breakdown voltage transistor.

The transistor Tr5 is, for example, an NMOS transistor, having a gate electrically connected to the power supply voltage $V_B$, a drain electrically connected to the output node Nout and the transistor Tr1, and a source electrically connected to the node N2. The transistor Tr5 is an enhancement-type transistor and is a high breakdown voltage transistor.

Here, even if the transistor Tr2 and the transistor Tr5 which are high breakdown voltage NMOS transistors have a high breakdown voltage exceeding the power supply voltage $V_H$, the breakdown voltage of the transistor Tr1 (more specifically, a breakdown voltage between the source and the drain and a breakdown voltage between the gate and a back gate) may be lower than the power supply voltage $V_H$. Reasons are as follows.

Figure 5C:
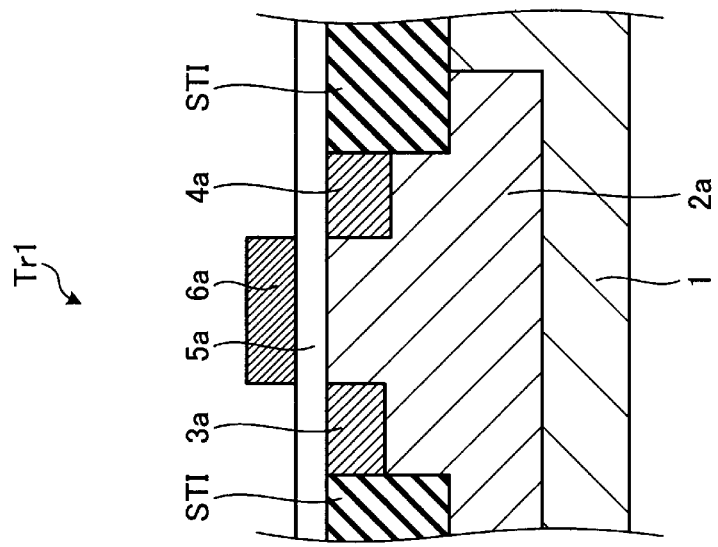
FIGS. 5A to 5C are cross-sectional views showing structures of transistors according to the embodiment.
Figure 5B:
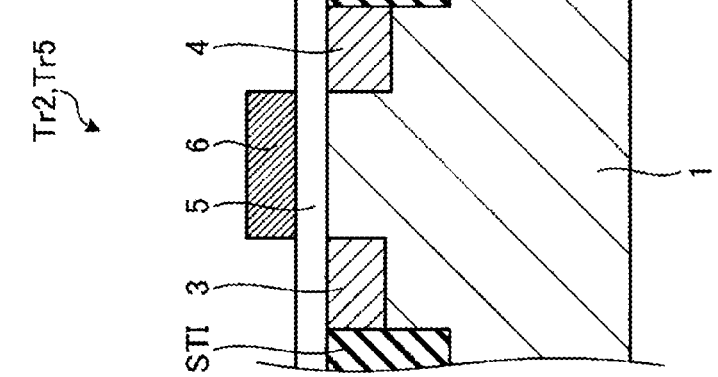
Figure 5A:
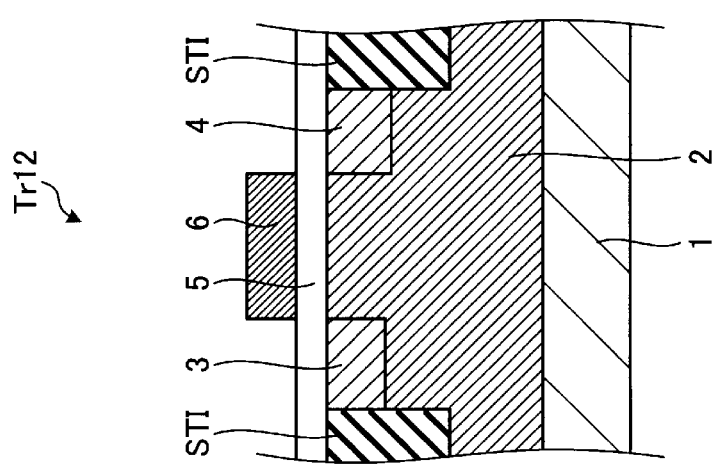

FIGS. 5A, 5B, and 5C show examples of cross-sectional structures of transistors. For example, the level conversion circuit 30 in the present embodiment is formed on a P-type substrate 1. As described above, the level conversion circuit 30 includes a low breakdown voltage NMOS transistor such as the transistor Tr12, a high breakdown voltage NMOS transistor such as the transistor Tr2, and a high breakdown voltage PMOS transistor such as the transistor Tr1. These transistors are separated by, for example, an element separation insulating portion STI formed on the P-type substrate 1.

For example, in a MOSFET, a breakdown voltage between a gate and a back gate can be improved by forming a thick gate oxide film. Further, for example, in the MOSFET, a breakdown voltage between a source and a drain can be improved by keeping a low impurity density in a part where a channel is formed.

FIG. 5A shows a configuration of the low breakdown voltage NMOS transistor such as the transistor Tr12. FIG. 5A is a cross-sectional view showing a structure of the transistor Tr12. In a region where the transistor Tr12 shown in FIG. 5A is formed, a P-well region 2 containing a higher concentration of P-type impurities is formed in the P-type substrate 1. An insulating film 5 is formed on the P-well region 2, and a gate electrode 6 is formed on the insulating film 5. Further, a source region 3 and a drain region 4 containing a high concentration of N-type impurities sandwich the P-well region 2.

FIG. 5B shows a configuration of the high breakdown voltage NMOS transistor such as the transistors Tr2 and Tr5. In a region where the transistors Tr2 and Tr5 shown in FIG. 5B are formed, the source region 3 and the drain region 4 containing the high concentration of N-type impurities are formed in the P-type substrate 1 without forming the P-well region 2. That is, in the transistor Tr12, the P-well region 2 is a channel region, whereas in the transistors Tr2 and Tr5, the P-type substrate 1 containing the low P-type impurities is the channel region. Therefore, the breakdown voltages of the transistors Tr2 and Tr5 (breakdown voltage between the source and the drain and breakdown voltage between the gate and the back gate) can be made higher than the breakdown voltage of transistor Tr12. Further, the breakdown voltages of the transistors Tr2 and Tr5 can be made higher than the power supply voltage $V_H$.

FIG. 5C shows a configuration of the high breakdown voltage PMOS transistor such as the transistor Tr1. In a region where the transistor Tr1 shown in FIG. 5C is formed, an N-well region 2a containing a higher concentration of N-type impurities is formed in the P-type substrate 1. An insulating film 5a is formed on the N-well region 2a, and a gate electrode 6a is formed on the insulating film 5a. Further, a source region 3a and a drain region 4a containing the high concentration of P-type impurities sandwich the N-well region 2a.

Here, the N-well region 2a is formed in the P-type substrate 1. That is, the N-well region 2a is formed in an opposite semiconductor type region. Therefore, in order to obtain the same carrier density, it is necessary to increase the impurity density when the N-well region 2a is formed in the P-type substrate 1 as compared with a case where the P-well region 2 is formed in the P-type substrate 1. Therefore, even if the transistor Tr2 and the transistor Tr5 which are high breakdown voltage NMOS transistors have the high breakdown voltage exceeding the power supply voltage $V_H$, the breakdown voltage of the transistor Tr1 which is the high breakdown voltage PMOS transistor may be lower than the power supply voltage $V_H$.

Therefore, in the level conversion circuit 30 shown in FIG. 4, a voltage applied to the transistor Tr1 is reduced by the transistor Tr2. Since the transistor Tr2 is a depletion-type transistor, the transistor Tr2 cuts off when a threshold voltage is a negative voltage and a source voltage is higher than a gate voltage by the threshold voltage.

For example, when an input voltage Vin to the level conversion circuit 30 changes from the H level to the L level, the transistor Tr1 is turned on. At this time, while maintaining the source voltage higher than the gate voltage of the transistor Tr2 by the threshold voltage, a positive feedback operation of a loop of the gate of the transistor Tr2→the source of the transistor Tr2→the node $N_{VM}$→the transistor Tr1→the output node Nout→the gate of the transistor Tr2 is performed. Accordingly, a level of an output voltage Vout is raised while a voltage between the source and the drain of the transistor Tr1 is maintained at about the threshold voltage of the transistor Tr2. Accordingly, the output voltage Vout from the level conversion circuit 30 can be changed from the L level to the H level while the voltage applied to the transistor Tr1 is reduced by the transistor Tr2.

On the other hand, in the level conversion circuit 30, it is necessary to consider an operation of setting the output voltage Vout from the H level to the L level when the input voltage Vin changes from the L level to the H level. For example, the positive feedback operation of the loop of the gate of the transistor Tr2→the source of the transistor Tr2→the node $N_{VM}$→the transistor Tr1→the output node Nout→the gate of the transistor Tr2 is performed and the output node Nout is set to the H level until the transistor Tr1 is turned off even when the input voltage Vin changes from the L level to the H level. At this time, when a driving force of transistor Tr5 is lower than driving forces of the transistor Tr1 and the transistor Tr2 even if the transistor Tr12 is turned on and the output node Nout is set to the L level together with the transistor Tr5, the output node Nout is maintained at an intermediate voltage between the L level and the H level and does not reach the L level.

Therefore, in order to avoid the output voltage becoming unstable in this way, the driving force of the transistor Tr5 is increased to be larger than the driving forces of the transistor Tr1 and the transistor Tr2. Accordingly, when the input voltage Vin changes from the L level to the H level, the output node Nout is forcibly brought down to the L level. Therefore, when the input voltage Vin changes from the L level to the H level, the output voltage Vout changes from the H level to the L level.

Figure 6A:
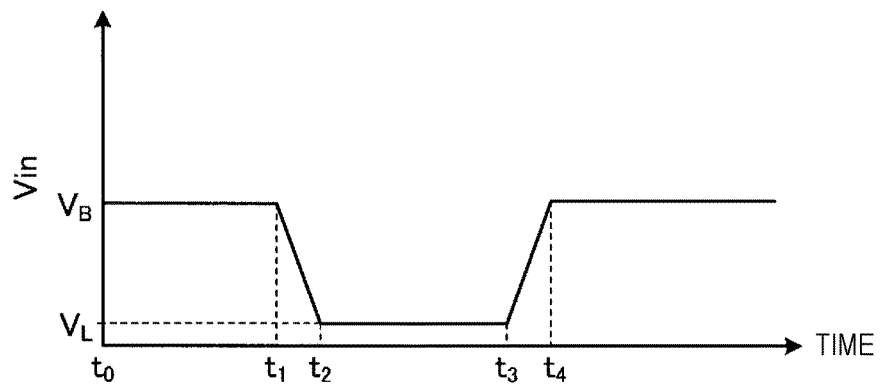
FIGS. 6A to 6D are waveform diagrams showing operations of the level conversion circuit according to the embodiment.
Figure 6B:
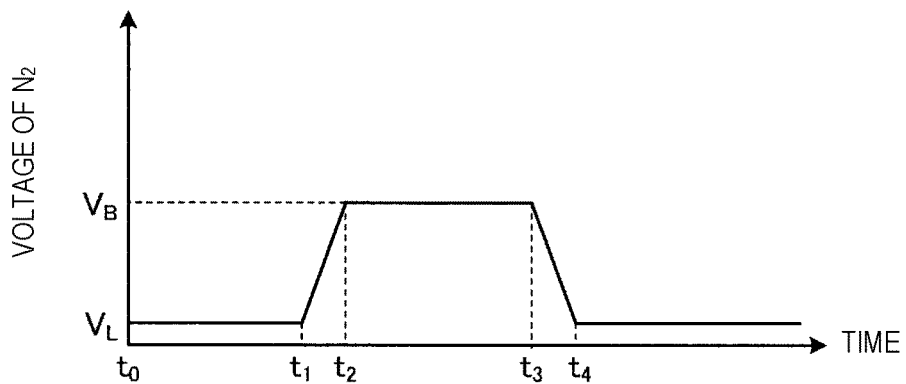
Figure 6C:
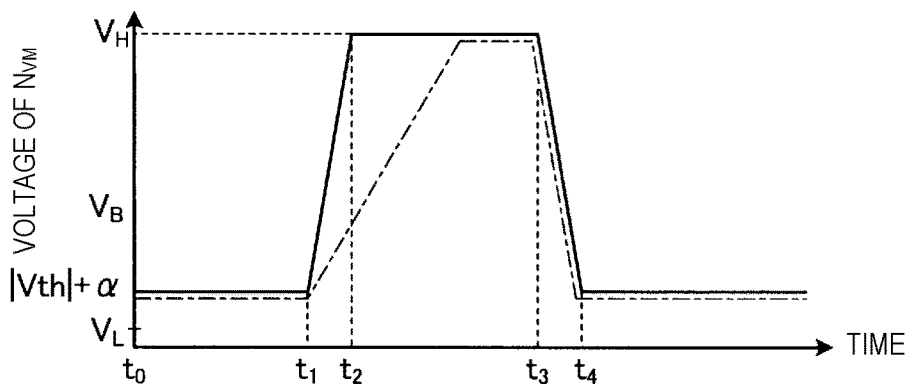
Figure 6D:
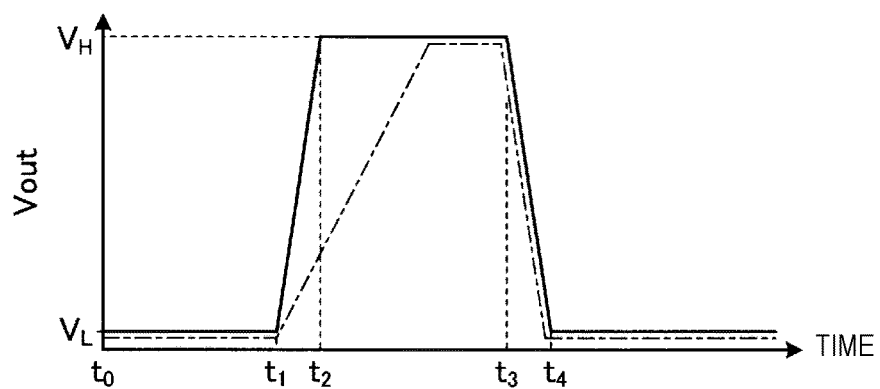

However, when the driving force of the transistor Tr5 is increased to be larger than the driving forces of the transistor Tr1 and the transistor Tr2, when the input signal Vin transitions as shown in FIG. 6A and a voltage of the node N2 changes as shown in FIG. 6B, a voltage of the node $N_{VM}$ changes as shown by a dashed-dotted line in FIG. 6C. FIGS. 6A to 6D are waveform diagrams showing an operation of the level conversion circuit 30. In the voltage transition of the node $N_{VM}$ shown by the dashed-dotted line in FIG. 6C, a delay from the L level to the H level is larger than a delay from the H level to the L level. As a result, as shown by the dashed-dotted line in FIG. 6D, in the voltage transition of the output voltage Vout, a delay from the L level to the H level is larger than a delay from the H level to the L level. That is, the level conversion operation may be slowed down. As a result, for example, the operation of the semiconductor storage device 10 may be slowed down.

Therefore, in the present embodiment, in the level conversion circuit 30, by adding a current limiting element which limits a current from the output node Nout to the gate of the transistor Tr2 and a voltage adjusting circuit which adjusts the node N1 of the gate of the transistor Tr2 to the ground voltage when the input voltage Vin is at the H level, the level conversion operation can be sped up.

Specifically, when the input voltage Vin changes from the H level to the L level, the transistor Tr1 is turned on, and an electric charge flows along the node $N_{VM}$→the transistor Tr1→the output node Nout. At this time, the voltage adjustment of the node N1 by the voltage adjusting circuit is stopped, the current limiting element limits the flow of the electric charge from the output node Nout to the gate of the transistor Tr2, and the electric charge on the output voltage Vout is charged quickly. Accordingly, the output voltage Vout can be caused to transition from the L level to the H level quickly. Further, when the input voltage Vin changes from the L level to the H level, the voltage adjusting circuit adjusts the node N1 of the gate of the transistor Tr2 to the ground voltage, and quickly turns off the transistor Tr1 and the transistor Tr2. At the same time, the current limiting element limits the positive feedback operation of the loop of the gate (node N1) of the transistor Tr2→the source of the transistor Tr2→the node $N_{VM}$→the transistor Tr1→the output node Nout→the gate (node N1) of the transistor Tr2. Accordingly, when the driving force of the transistor Tr5 is a normal driving force, the transistor Tr5 can easily draw the output node Nout to the L level, and can cause the output voltage Vout to transition from the H level to the L level quickly. Therefore, the level conversion circuit 30 can speed up the transition from the L level to the H level and the transition from the H level to the L level of the output voltage Vout, and can perform the level conversion operation quickly.

More specifically, as shown in FIG. 4, the level conversion circuit 30 includes a current limiting element 31 and a voltage adjusting circuit 32.

The current limiting element 31 is electrically connected between the node N1 and the output node Nout. The node N1 is electrically connected to the gate of the transistor Tr2. Accordingly, the current limiting element 31 can limit the current from the output node Nout to the node N1 of the gate of the transistor Tr2.

The current limiting element 31 includes a resistance element R1. One end of the resistance element R1 is electrically connected to the node N1 and the other end is electrically connected to the output node Nout. The resistance element R1 can limit the current from the output node Nout to the node N1 of the gate of the transistor Tr2.

The voltage adjusting circuit 32 is disposed between the input node Nin and the node N1, and is electrically connected between the input node Nin and the node N1. The voltage adjusting circuit 32 adjusts the voltage of the node N1 to, for example, the ground voltage in accordance with a signal input to the input node Nin.

The voltage adjusting circuit 32 includes a transistor Tr4. The transistor Tr4 is, for example, an NMOS transistor, having a gate electrically connected to the input node Nin, a drain electrically connected to the node N1, and a source electrically connected to the ground voltage. The transistor Tr4 is an enhancement-type transistor and is a high breakdown voltage transistor. The transistor Tr4 is turned off when the input voltage Vin changes from the H level to the L level, and is turned on when the input voltage Vin changes from the L level to the H level. Accordingly, the transistor Tr4 can adjust the node N1 to the ground voltage when the input voltage Vin changes from the L level to the H level.

Figure 7A:
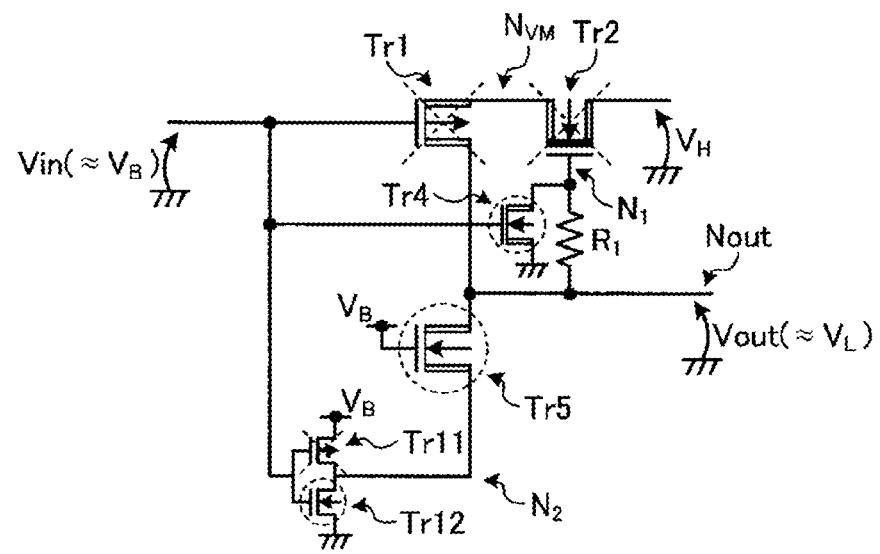
FIGS. 7A and 7B show an operation (when an output voltage transitions from an L level to an H level) of the level conversion circuit according to the embodiment.
Figure 7B:
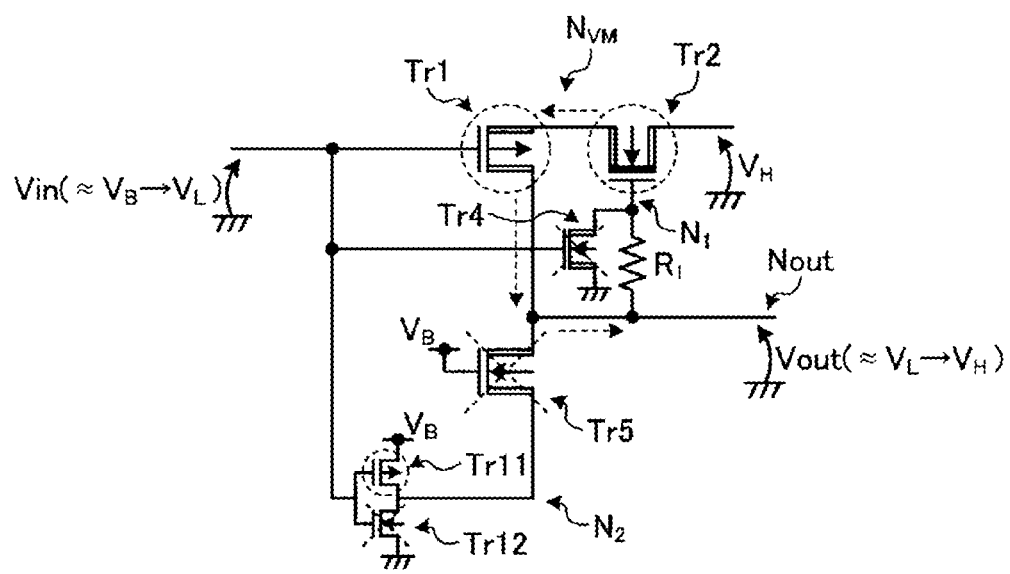
Figure 8A:
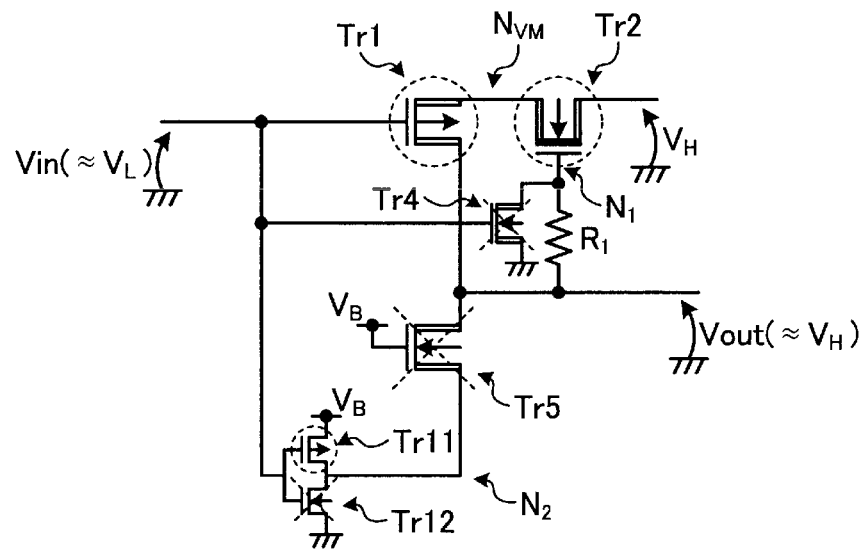
FIGS. 8A and 8B show an operation (when the output voltage transitions from the H level to the L level) of the level conversion circuit according to the embodiment.
Figure 8B:
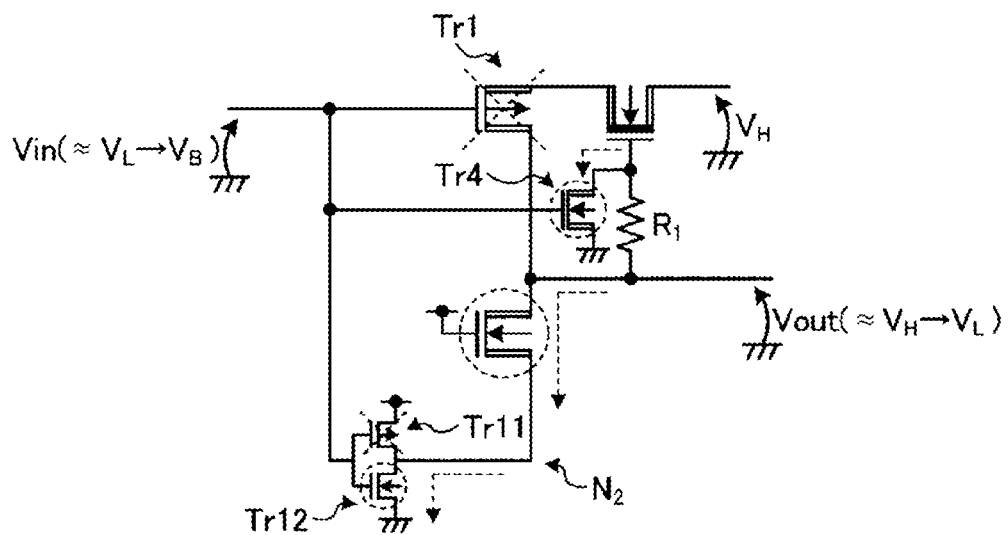

For example, the level conversion circuit 30 operates as shown in FIGS. 6A to 8B. FIGS. 7A and 7B show an operation (when the output voltage transitions from the L level to the H level) of the level conversion circuit 30. FIGS. 8A and 8B show an operation (when the output voltage transitions from the H level to the L level) of the level conversion circuit 30.

During a period from a timing t0 to a timing t1 shown in FIGS. 6A to 6D, as shown in FIG. 7A, the input voltage Vin is maintained at the H level corresponding to the power supply voltage $V_B$ (hereinafter, H level $V_B$) (see FIG. 6A). Accordingly, the transistor Tr1 is maintained in the off state, the transistor Tr4 is maintained in the on state, the transistor Tr11 is maintained in the off state, and the transistor Tr12 is maintained in the on state. The transistor Tr12 draws the node N2 to the L level (≈the ground voltage), and the voltage of the node N2 is maintained at the L level (see FIG. 6B). The transistor Tr4 draws the node N1 to the L level $V_L$ (for example, the ground voltage), and the voltage of the node N1 is maintained at the L level $V_L$. At this time, since the voltage of the node $N_{VM}$ is slightly larger than an absolute value of the threshold voltage and is |Vth|+α(α>0) (see FIG. 6C), the transistor Tr2 is cut off because the voltage between the gate and the source is less than the threshold voltage. Since the voltage between the gate and the source of the transistor Tr5 is $V_B$, the transistor Tr5 is maintained in the on state, and the output node Nout is drawn to the L level $V_L$ which is the voltage of the node N2 and maintained at the L level $V_L$ (see FIG. 6D).

During a period from the timing t1 to a timing t2 shown in FIGS. 6A to 6D, as shown in FIG. 7B, the input voltage Vin transitions from the H level $V_B$ to the L level $V_L$. Accordingly, the transistor Tr1 is turned on, the transistor Tr4 is turned off, the transistor Tr11 is turned on, and the transistor Tr12 is turned off. The transistor Tr11 charges the node N2, and the voltage of the node N2 rises from the L level $V_L$ to the H level $V_B$ (see FIG. 6B). The transistor Tr5 is cut off because the voltage between the gate and the source is substantially zero and is less than the threshold voltage. Further, since the transistor Tr4 is off, when the transistor Tr1 is turned on, the electric charge is charged in a path of the node $N_{VM}$→the transistor Tr1→the output node Nout, and the voltage of the output node Nout rises from the L level $V_L$. When almost no electric charge flows through the resistance element R1, the output node Nout and the node N1 can have almost the same voltage. Therefore, as the voltage of the output node Nout rises, the voltage of the node N1 also rises and the transistor Tr2 is turned on. Accordingly, the voltage of the node $N_{VM}$ rises from |Vth|+α to the H level corresponding to the power supply voltage $V_H$ (hereinafter, H level $V_B$) (see FIG. 6C), and the output voltage Vout rises to the H level $V_H$ (see FIG. 6D).

During a period from the timing t2 to a timing t3 shown in FIGS. 6A to 6D, as shown in FIG. 8A, the input voltage Vin is maintained at the L level $V_L$ corresponding to the power supply voltage $V_B$ (see FIG. 6A). Accordingly, the transistor Tr1 is maintained in the on state, the transistor Tr4 is maintained in the off state, the transistor Tr11 is maintained in the on state, and the transistor Tr12 is maintained in the off state. The transistor Tr11 draws the node N2 to the H level $V_B$, and the voltage of the node N2 is maintained at the H level $V_B$ (see FIG. 6B). The transistor Tr4 is turned off, and the voltage of the node N1 is maintained at about "H level $V_H$-|Vth|". At this time, since the voltage of the node $N_{VM}$ is at the H level $V_H$ (see FIG. 6C), the transistor Tr2 is turned on when the voltage between the gate and the source becomes equal to or higher than the threshold voltage. The transistor Tr5 is maintained in the off state because the voltage between the gate and the source is substantially zero. The transistor Tr1 is maintained in the on state, the output node Nout is raised to the H level $V_H$ which is the voltage of the $N_{VM}$, and the output voltage Vout is maintained at the H level $V_H$ (see FIG. 6D).

During a period from the timing t3 to a timing t4 shown in FIGS. 6A to 6D, as shown in FIG. 8B, the input voltage Vin transitions from the L level $V_L$ to the H level $V_B$. Accordingly, the transistor Tr4 is turned on, the transistor Tr11 is turned off, and the transistor Tr12 is turned on. When the transistor Tr4 is turned on, the voltage of node N1 drops from the H level $V_H$ to the L level $V_L$. Further, the transistor Tr11 draws charge from the node N2, and the voltage of the node N2 drops from the H level $V_B$ to the L level $V_L$ (see FIG. 6B). Accordingly, the transistor Tr5 is turned on when the voltage between the gate and the source exceeds the threshold voltage, draws charge from the node $N_{VM}$ and the output node Nout, and draws the voltages of the node $N_{VM}$ and the output node Nout to the voltage of the node N2. When the voltage of the node $N_{VM}$ is |Vth|+α, the transistor Tr1 becomes almost equipotential with the input voltage Vin and is turned off (see FIG. 6C). The transistor Tr5 is maintained in the on state, the output node Nout is drawn to the L level $V_L$ which is the voltage of the node N2, and the output voltage Vout becomes the L level $V_L$ (see FIG. 6D).

A period after the timing t4 is the same as the period from the timing t0 to the timing t1.

As described above, in the present embodiment, the level conversion circuit 30 further includes the current limiting element 31 which limits the current from the output node Nout to the gate of the transistor Tr2 and the voltage adjusting circuit 32 which adjusts the gate of the transistor Tr2 to the ground voltage when the input voltage Vin is the H level. Accordingly, the transition from the L level to the H level and the transition from the H level to the L level of the output voltage Vout can be sped up, and the level conversion operation can be sped up.

Figure 9:
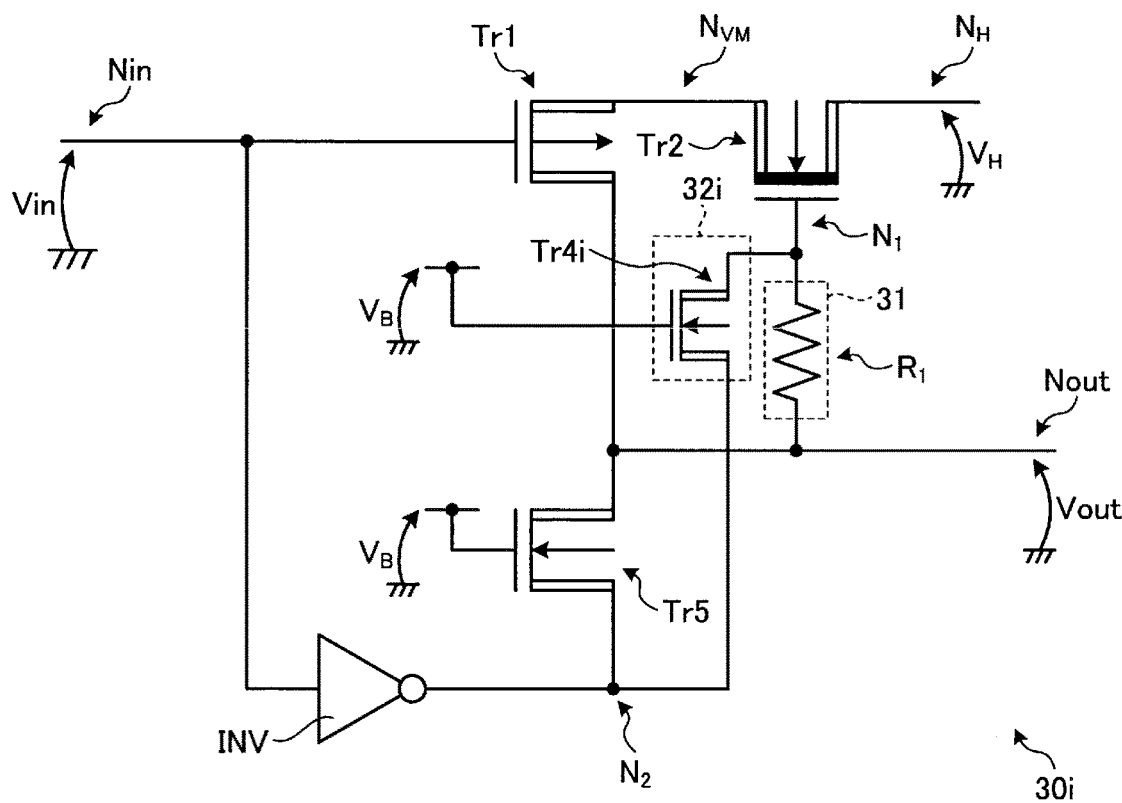
FIG. 9 is a circuit diagram showing a configuration of a level conversion circuit according to a first modification of the embodiment.

As shown in FIG. 9, a voltage adjusting circuit 32i in a level conversion circuit 30i may include a transistor Tr4i configured in the same manner as the transistor Tr5 instead of the transistor Tr4 (see FIG. 4). FIG. 9 is a circuit diagram showing a configuration of the level conversion circuit 30i according to a first modification of the embodiment.

The transistor Tr4i is, for example, an NMOS transistor, having a gate electrically connected to the power supply voltage $V_B$, a drain electrically connected to the node N1, and a source electrically connected to the node N2. The transistor Tr4i is an enhancement-type transistor and is a high breakdown voltage transistor. The transistor Tr4i is turned off when the input voltage Vin changes from the H level to the L level, and is turned on when the input voltage Vin changes from the L level to the H level. Accordingly, the transistor Tr4i can adjust the node N1 to the ground voltage when the input voltage Vin changes from the L level to the H level.

With this configuration, when the input voltage Vin changes from the H level to the L level, the voltage adjustment of the node N1 by the voltage adjusting circuit 32i is stopped, and the current limiting element 31 can limit the flow of the electric charge from the output node Nout to the gate of the transistor Tr2. Further, when the input voltage Vin changes from the L level to the H level, the voltage adjusting circuit 32i can adjust the node N1 of the gate of the transistor Tr2 to the ground voltage, and can quickly turn off the transistor Tr1 and the transistor Tr2. At the same time, the current limiting element 31 can limit the positive feedback operation of the loop of the gate (node N1) of the transistor Tr2→the source of the transistor Tr2→the node $N_{VM}$→the transistor Tr1→the output node Nout→the gate (node N1) of the transistor Tr2.

Therefore, the level conversion circuit 30i can speed up the transition from the L level to the H level and the transition from the H level to the L level of the output voltage Vout, and can perform the level conversion operation quickly.

Figure 10:
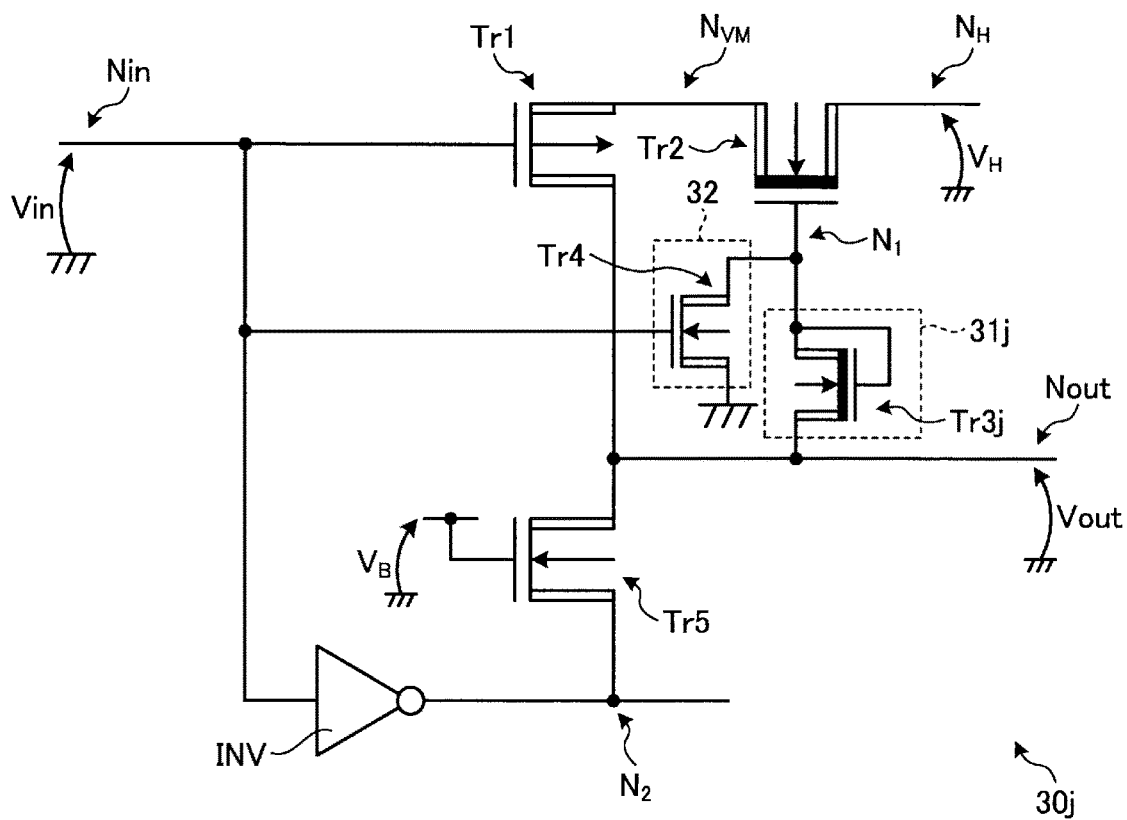
FIG. 10 is a circuit diagram showing a configuration of a level conversion circuit according to a second modification of the embodiment.

Alternatively, as shown in FIG. 10, a current limiting element 31j in a level conversion circuit 30j may include a transistor Tr3j which operates as a constant current source instead of the resistance element R1 (see FIG. 4). FIG. 10 is a circuit diagram showing a configuration of the level conversion circuit 30j according to a second modification of the embodiment.

The transistor Tr3j is, for example, an NMOS transistor, having a gate and a source that are electrically connected to each other and are electrically connected to the node N1, and a drain electrically connected to the output node Nout. The transistor Tr3j is a depletion-type transistor and is a high breakdown voltage transistor. The transistor Tr3j functions as a constant current source which limits a current flowing in a direction from the output node Nout to the node N1 to a constant current.

With this configuration, when the input voltage Vin changes from the H level to the L level, the voltage adjustment of the node N1 by the voltage adjusting circuit 32 is stopped, and the current limiting element 31j can limit the flow of the electric charge from the output node Nout to the gate of the transistor Tr2. Further, when the input voltage Vin changes from the L level to the H level, the voltage adjusting circuit 32 can adjust the node N1 of the gate of the transistor Tr2 to the ground voltage, and can quickly turn off the transistor Tr1 and the transistor Tr2. At the same time, the current limiting element 31j can limit the positive feedback operation of the loop of the gate (node N1) of the transistor Tr2→the source of the transistor Tr2→the node $N_{VM}$→the transistor Tr1→the output node Nout→the gate (node N1) of the transistor Tr2.

Therefore, the level conversion circuit 30j can speed up the transition from the L level to the H level and the transition from the H level to the L level of the output voltage Vout, and can perform the level conversion operation quickly.

Figure 11:
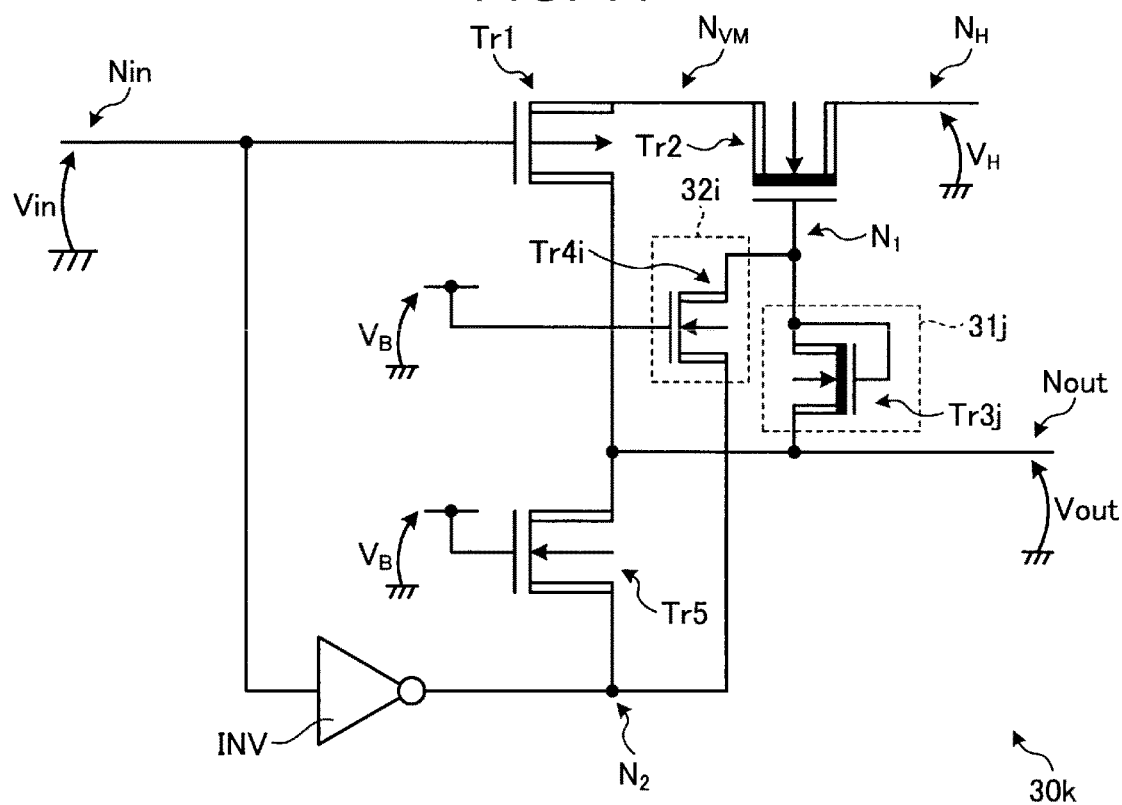
FIG. 11 is a circuit diagram showing a configuration of a level conversion circuit according to a third modification of the embodiment.

Alternatively, as shown in FIG. 11, a level conversion circuit 30k may be formed by combining the first modification and the second modification. FIG. 11 is a circuit diagram showing a configuration of a level conversion circuit according to a third modification of the embodiment.

In the level conversion circuit 30k, the voltage adjusting circuit 32i may include the transistor Tr4i configured in the same manner as the transistor Tr5 instead of the transistor Tr4 (see FIG. 4). The current limiting element 31j may include the diode-connected transistor Tr3j instead of the resistance element R1 (see FIG. 4). The configuration and operation of the voltage adjusting circuit 32i are the same as those of the first modification, and the configuration and operation of the current limiting element 31j are the same as those of the second modification. Therefore, even in the level conversion circuit 30k, the transition from the L level to the H level and the transition from the H level to the L level of the output voltage Vout can be sped up, and the level conversion operation can be performed quickly.

Figure 12:
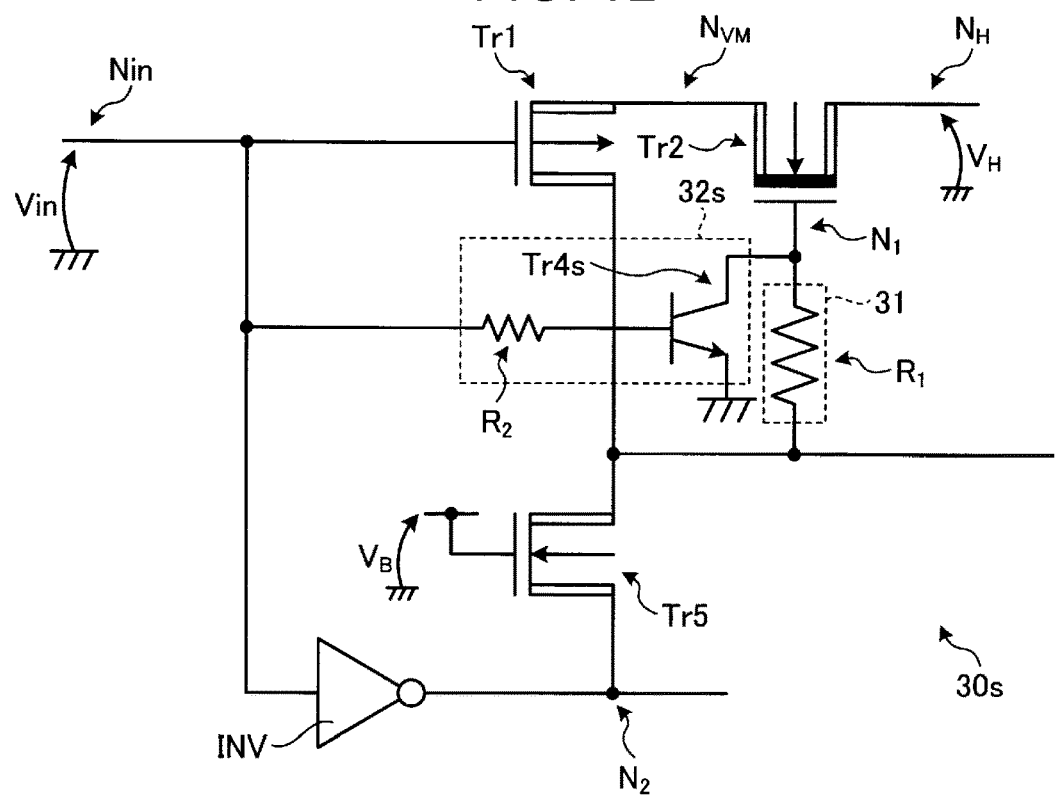
FIG. 12 is a circuit diagram showing a configuration of a level conversion circuit according to a fourth modification of the embodiment.

Alternatively, as shown in FIG. 12, a voltage adjusting circuit 32s in a level conversion circuit 30s may include a resistance element R2 and a bipolar-type transistor Tr4s instead of the transistor Tr4 (see FIG. 4). FIG. 12 is a circuit diagram showing a configuration of the level conversion circuit 30s according to a fourth modification of the embodiment.

The transistor Tr4s is, for example, an NPN bipolar transistor, having a base electrically connected to the input node Nin via the resistance element R2, a collector electrically connected to the node N1, and an emitter electrically connected to the ground voltage. One end of the resistance element R2 is electrically connected to the input node Nin and the other end is electrically connected to the base of the transistor Tr4s. When the input voltage Vin changes from the H level to the L level, the transistor Tr4s is turned off when a current amount through the resistance element R2 is less than a threshold, and when the input voltage Vin changes from the L level to the H level, the transistor Tr4s is turned on when the current amount through the resistance element R2 is larger than the threshold. When the transistor Tr4s is turned on, a current flowing from the node N1 toward the ground voltage through the collector and the emitter flows through the transistor Tr4s. Accordingly, the transistor Tr4s can adjust the node N1 to the ground voltage when the input voltage Vin changes from the L level to the H level.

With this configuration, when the input voltage Vin changes from the H level to the L level, the voltage adjustment of the node N1 by the voltage adjusting circuit 32s is stopped, and the current limiting element 31 can limit the flow of the electric charge from the output node Nout to the gate of the transistor Tr2. Further, when the input voltage Vin changes from the L level to the H level, the voltage adjusting circuit 32s can adjust the node N1 of the gate of the transistor Tr2 to the ground voltage, and can quickly turn off the transistor Tr1 and the transistor Tr2. At the same time, the current limiting element 31 can limit the positive feedback operation of the loop of the gate (node N1) of the transistor Tr2→the source of the transistor Tr2→the node $N_{VM}$→the transistor Tr1→the output node Nout→the gate (node N1) of the transistor Tr2.

Therefore, the level conversion circuit 30s can speed up the transition from the L level to the H level and the transition from the H level to the L level of the output voltage Vout, and can perform the level conversion operation quickly.

In the configuration in FIG. 12, the current limiting element 31 may be replaced with the current limiting element 31j (see FIG. 10) of the second modification.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. For example, the above embodiment describes a semiconductor storage device including a memory cell array as an example. The present disclosure can be appropriately applied to any semiconductor device which uses a high voltage internally.

What is claimed is:

1. A semiconductor device comprising:
a level conversion circuit, wherein
the level conversion circuit includes:
a first transistor having a gate connected to an input node to which a signal corresponding to a first power supply voltage is input;
a second transistor having a drain connected to a second power supply voltage higher than the first power supply voltage, a source connected to a source of the first transistor, and a gate connected to a first node;
a current limiting element electrically connected between the first node and an output node; and
a voltage adjusting circuit configured to adjust a voltage of the first node in accordance with the signal input to the input node.

2. The semiconductor device according to claim 1, wherein
the first transistor is an enhancement-type transistor, and the second transistor is a depletion-type transistor.

3. The semiconductor device according to claim 1, wherein
the current limiting element includes:
a first resistance element having one end electrically connected to the first node and the other end electrically connected to the output node.

4. The semiconductor device according to claim 1, wherein
the current limiting element includes:
a third transistor having a gate and a source that are electrically connected to the first node and a drain electrically connected to the output node.

5. The semiconductor device according to claim 4, wherein
the third transistor is a depletion-type transistor.

6. The semiconductor device according to claim 1, wherein
the voltage adjusting circuit includes:
a fourth transistor maintained in an off state during a period in which the first transistor is on and maintained in an on state during a period in which the first transistor is off.

7. The semiconductor device according to claim 6, wherein
the level conversion circuit further includes a fifth transistor having a gate connected to the first power supply voltage, a drain connected to the output node, and a source connected to a second node, and
the fourth transistor includes a gate connected to the input node, a source connected to a ground voltage, and a drain connected to the first node.

8. The semiconductor device according to claim 4, wherein
the voltage adjusting circuit includes a fourth transistor maintained in an off state during a period in which the first transistor is on and maintained in an on state during a period in which the first transistor is off, and the level conversion circuit further includes a fifth transistor having a gate connected to the first power supply voltage, a drain connected to the output node, and a source connected to a second node, and
the fourth transistor includes a gate connected to the input node, a source connected to a ground voltage, and a drain connected to the first node.

9. The semiconductor device according to claim 6, wherein
the level conversion circuit further includes:
a fifth transistor having a gate connected to the first power supply voltage, a drain connected to the output node, and a source connected to a second node; and
a second resistance element having one end connected to the input node, and the fourth transistor includes a base connected to the other end of the second resistance element, an emitter connected to a ground voltage, and a collector connected to the first node.

10. The semiconductor device according to claim 1, wherein the level conversion circuit further includes:
a fourth transistor having a gate connected to the first power supply voltage, a source connected to a second node, and a drain connected to the first node; and
a fifth transistor having a gate connected to the first power supply potential, a drain connected to the output node, and a source connected to the second node.

11. The semiconductor device according to claim 1, further comprising:
a memory cell array, wherein the level conversion circuit is disposed around the memory cell array.

12. A semiconductor device comprising:
a memory cell array having a plurality of blocks; and
a row decoder circuit including a block decoder configured to generate a block selection signal using which one of the blocks is selected,
wherein the block decoder includes a level conversion circuit that outputs the block selection signal, the level conversion circuit including:
a first transistor having a gate connected to an input node to which a signal corresponding to a first power supply voltage is input;
a second transistor having a drain connected to a second power supply voltage higher than the first power supply voltage, a source connected to a source of the first transistor, and a gate connected to a first node;
a current limiting element electrically connected between the first node and an output node through which the block selection signal is output; and
a voltage adjusting circuit configured to adjust a voltage of the first node in accordance with the signal input to the input node.

13. The semiconductor device according to claim 12, wherein the first transistor is an enhancement-type transistor, and the second transistor is a depletion-type transistor.

14. The semiconductor device according to claim 12, wherein the current limiting element includes a first resistance element having one end electrically connected to the first node and the other end electrically connected to the output node.

15. The semiconductor device according to claim 12, wherein the current limiting element includes a third transistor having a gate and a source that are electrically connected to the first node and a drain electrically connected to the output node.

16. The semiconductor device according to claim 12, wherein the voltage adjusting circuit includes a fourth transistor maintained in an off state during a period in which the first transistor is on and maintained in an on state during a period in which the first transistor is off.

17. The semiconductor device according to claim 16, wherein
the level conversion circuit further includes a fifth transistor having a gate connected to the first power supply voltage, a drain connected to the output node, and a source connected to a second node, and
the fourth transistor includes a gate connected to the input node, a source connected to a ground voltage, and a drain connected to the first node.

18. The semiconductor device according to claim 15, wherein
the voltage adjusting circuit includes a fourth transistor maintained in an off state during a period in which the first transistor is on and maintained in an on state during a period in which the first transistor is off, and the level conversion circuit further includes a fifth transistor having a gate connected to the first power supply voltage, a drain connected to the output node, and a source connected to a second node, and
the fourth transistor includes a gate connected to the input node, a source connected to a ground voltage, and a drain connected to the first node.

19. The semiconductor device according to claim 16, wherein
the level conversion circuit further includes:
a fifth transistor having a gate connected to the first power supply voltage, a drain connected to the output node, and a source connected to a second node; and
a second resistance element having one end connected to the input node, and
the fourth transistor includes a base connected to the other end of the second resistance element, an emitter connected to a ground voltage, and a collector connected to the first node.

20. The semiconductor device according to claim 12, wherein the level conversion circuit further includes:
a fourth transistor having a gate connected to the first power supply voltage, a source connected to a second node, and a drain connected to the first node; and
a fifth transistor having a gate connected to the first power supply potential, a drain connected to the output node, and a source connected to the second node.

* * * * *